(12) United States Patent
Kawamura et al.

(10) Patent No.: US 11,532,704 B2
(45) Date of Patent: Dec. 20, 2022

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Keiko Kawamura, Yokohama Kanagawa (JP); Tomoko Matsudai, Shibuya Tokyo (JP); Yoko Iwakaji, Meguro Tokyo (JP); Kaori Fuse, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/942,134

(22) Filed: Jul. 29, 2020

(65) Prior Publication Data
US 2021/0305366 A1  Sep. 30, 2021

(30) Foreign Application Priority Data
Mar. 24, 2020 (JP) .............................. JP2020-053072

(51) Int. Cl.
| H01L 29/06 | (2006.01) |
| H01L 29/45 | (2006.01) |
| H01L 29/739 | (2006.01) |
| H01L 29/78 | (2006.01) |
| H01L 29/732 | (2006.01) |

(52) U.S. Cl.
CPC .......... H01L 29/0657 (2013.01); H01L 29/45 (2013.01); H01L 29/7393 (2013.01)

(58) Field of Classification Search
CPC . H01L 29/0657; H01L 29/45; H01L 29/7393; H01L 29/0696
See application file for complete search history.

(56) References Cited

U.S. PATENT DOCUMENTS

| 6,551,909 B1 * | 4/2003 | Fujihira ............ H01L 29/66333 438/510 |
| 6,844,592 B2 | 1/2005 | Yamaguchi et al. |
| 8,373,247 B2 | 2/2013 | Saito et al. |
| 9,166,036 B2 | 10/2015 | Tamaki |

(Continued)

FOREIGN PATENT DOCUMENTS

| JP | 3908572 B2 | 4/2007 |
| JP | 2011-181805 A | 9/2011 |

(Continued)

Primary Examiner — Herve-Louis Y Assouman
(74) Attorney, Agent, or Firm — Allen & Overy LLP

(57) ABSTRACT

A semiconductor device has a cell part and a terminal part set in the device. The terminal part encloses the cell part. The semiconductor device includes a first electrode, a first semiconductor layer of a first conductive type, a second semiconductor layer of a second conductive type, and an insulating layer. The first semiconductor layer is formed above the first electrode. The second semiconductor layer is provided in an upper portion of the first semiconductor layer, and has an impurity concentration profile along a vertical direction including a plurality of peaks. The insulating layer is provided on the second semiconductor layer.

17 Claims, 16 Drawing Sheets

(56) References Cited

U.S. PATENT DOCUMENTS

| | | | |
|---|---|---|---|
| 2005/0199953 A1* | 9/2005 | Kawamura | H01L 29/7813 257/341 |
| 2005/0253187 A1* | 11/2005 | Kawamura | H01L 29/41758 257/328 |
| 2008/0251810 A1* | 10/2008 | Torii | H01L 29/7397 257/139 |
| 2018/0240905 A1 | 8/2018 | Eguchi et al. | |
| 2018/0374918 A1* | 12/2018 | Nishio | H01L 29/0615 |
| 2019/0296134 A1* | 9/2019 | Matsudai | H01L 29/0619 |

FOREIGN PATENT DOCUMENTS

| | | |
|---|---|---|
| JP | 6207676 B2 | 10/2017 |
| JP | 6324805 B2 | 5/2018 |

* cited by examiner

US 11,532,704 B2

SEMICONDUCTOR DEVICE

CROSS-REFERENCE TO RELATED APPLICATIONS

This application is based upon and claims the benefit of priority from the prior Japanese Patent Application No. 2020-053072, filed on Mar. 24, 2020; the entire contents of which are incorporated herein by reference.

FIELD

Embodiments relate to a semiconductor device.

BACKGROUND

A high breakdown voltage semiconductor device such as an IGBT (Insulated Gate Bipolar Transistor), a MOSFET (Metal-Oxide-Semiconductor-Field-Effect-Transistor), a FRD (Fast Recovery Diode (a high-speed rectifying element)), or the like are used in a power device that switches current supplied to an electric train or the like. In such a high breakdown voltage semiconductor device, a diffusion layer is formed in the semiconductor layer of the terminal part to suppress the concentration of the electric field of the terminal part in the OFF-state and to prevent breakdown of the terminal part.

However, when avalanche occurs in the terminal part, there are cases where breakdown occurs because the removal of the carriers is insufficient.

DETAILED DESCRIPTION

Figure 1:
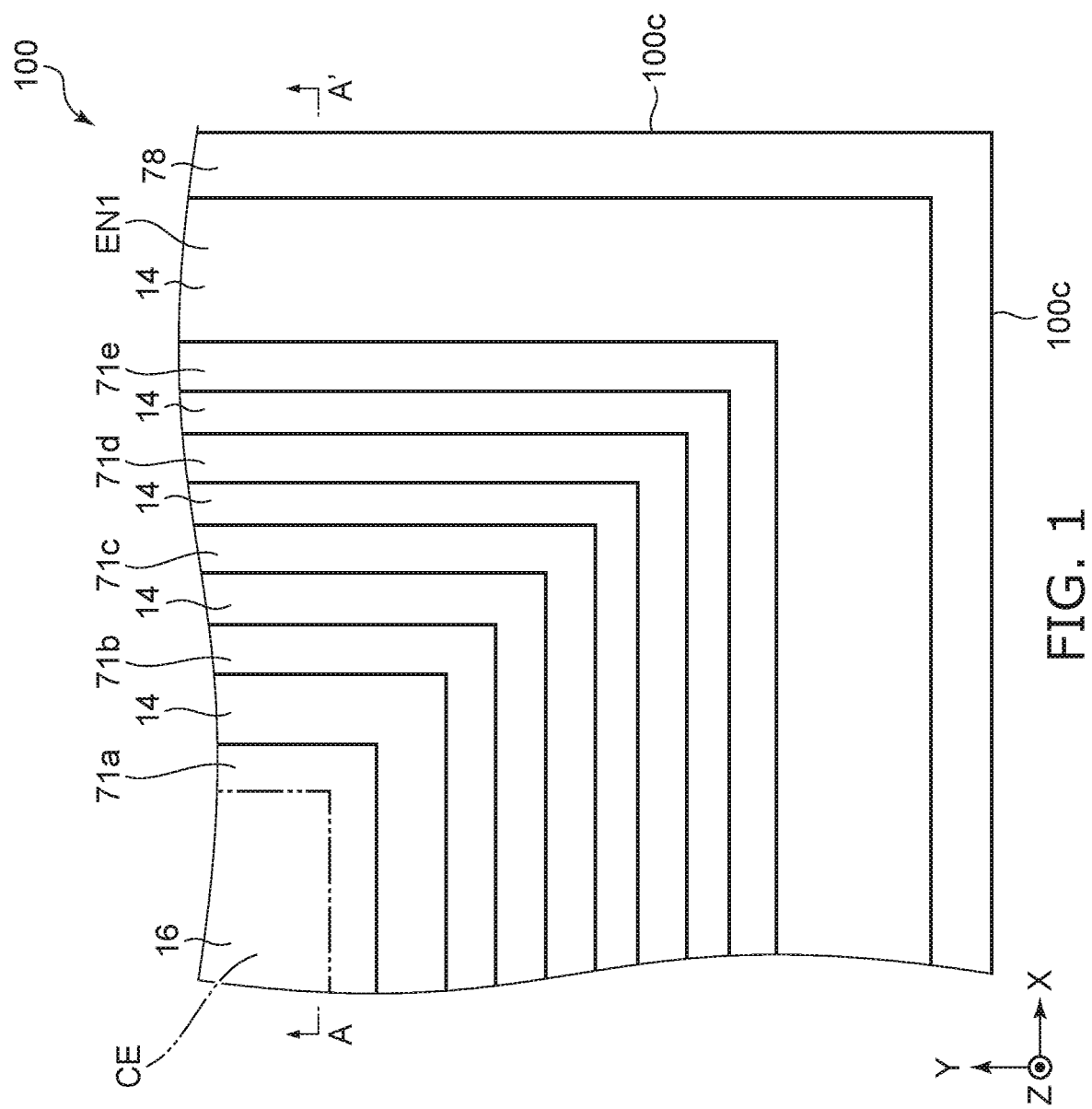
FIG. 1 is a plan view showing a semiconductor device according to a first embodiment.

A semiconductor device according to an embodiment has a cell part and a terminal part set in the device. The terminal part encloses the cell part. The semiconductor device includes a first electrode, a first semiconductor layer of a first conductive type, a second semiconductor layer of a second conductive type, and an insulating layer. The first semiconductor layer is formed above the first electrode. The second semiconductor layer is provided in an upper portion of the first semiconductor layer, and has an impurity concentration profile along a vertical direction including a plurality of peaks. The insulating layer is provided on the second semiconductor layer.

A semiconductor device according to an embodiment has a cell part and a terminal part set in the device. The terminal part encloses the cell part. The semiconductor device includes a first electrode, a first semiconductor layer of a first conductive type, a second semiconductor layer, and an insulating layer. The first semiconductor layer is formed above the first electrode. The second semiconductor layer is provided in an upper portion of the first semiconductor layer, includes a plurality of partial semiconductor layers of second conductivity type. The plurality of partial semiconductor layers are separated in a vertical direction, and the first semiconductor layer is interposed in a gap between the plurality of partial semiconductor layers. The insulating layer is provided on the second semiconductor layer.

The embodiments will be described hereinafter with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions. In the specification and drawings, components similar to those described previously or illustrated in an antecedent drawing are marked with like reference numerals, and a detailed description is omitted as appropriate.

First Embodiment

Figure 2:
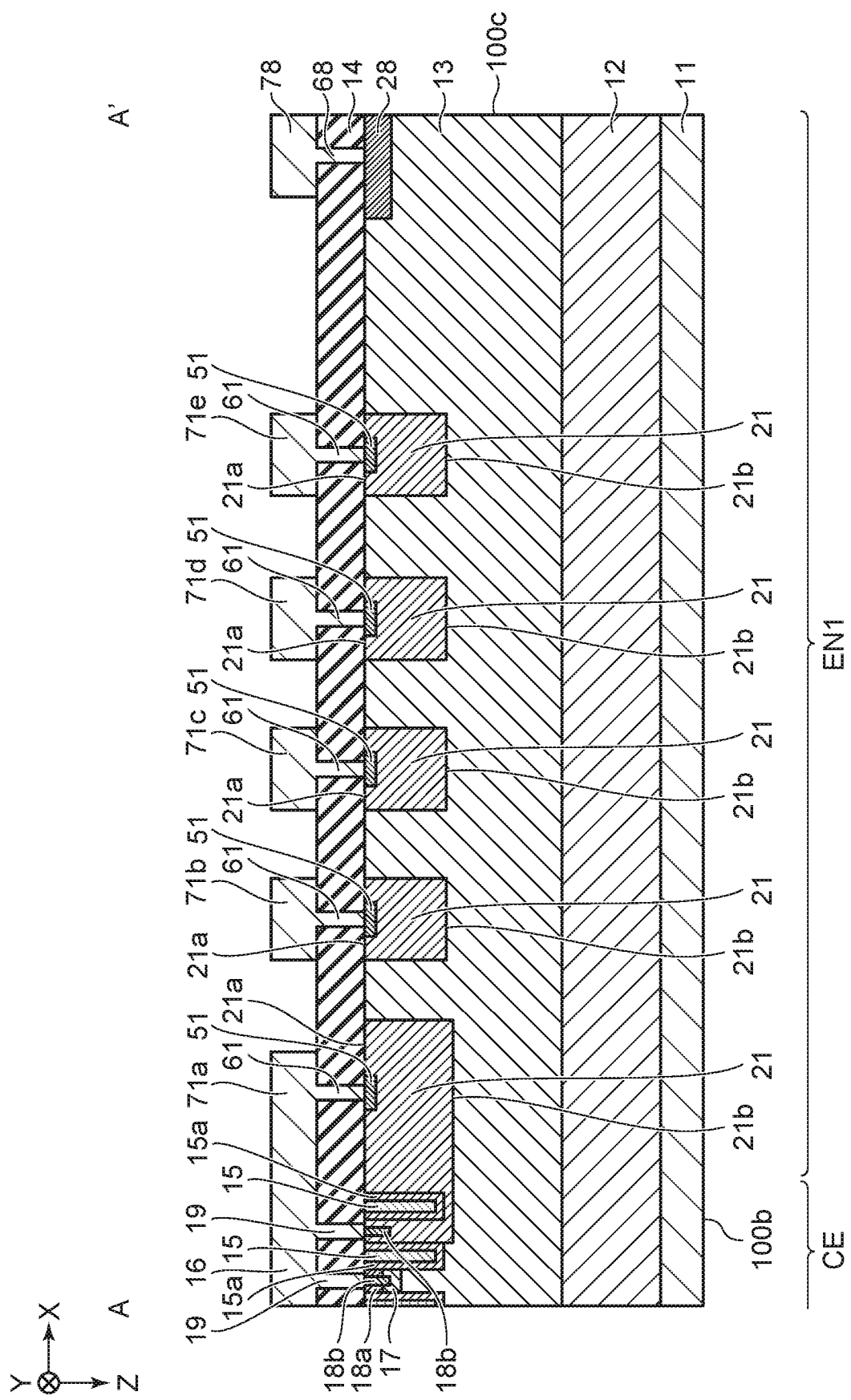
FIG. 2 is a cross-sectional view along line A-A' shown in FIG. 1.
Figure 3:
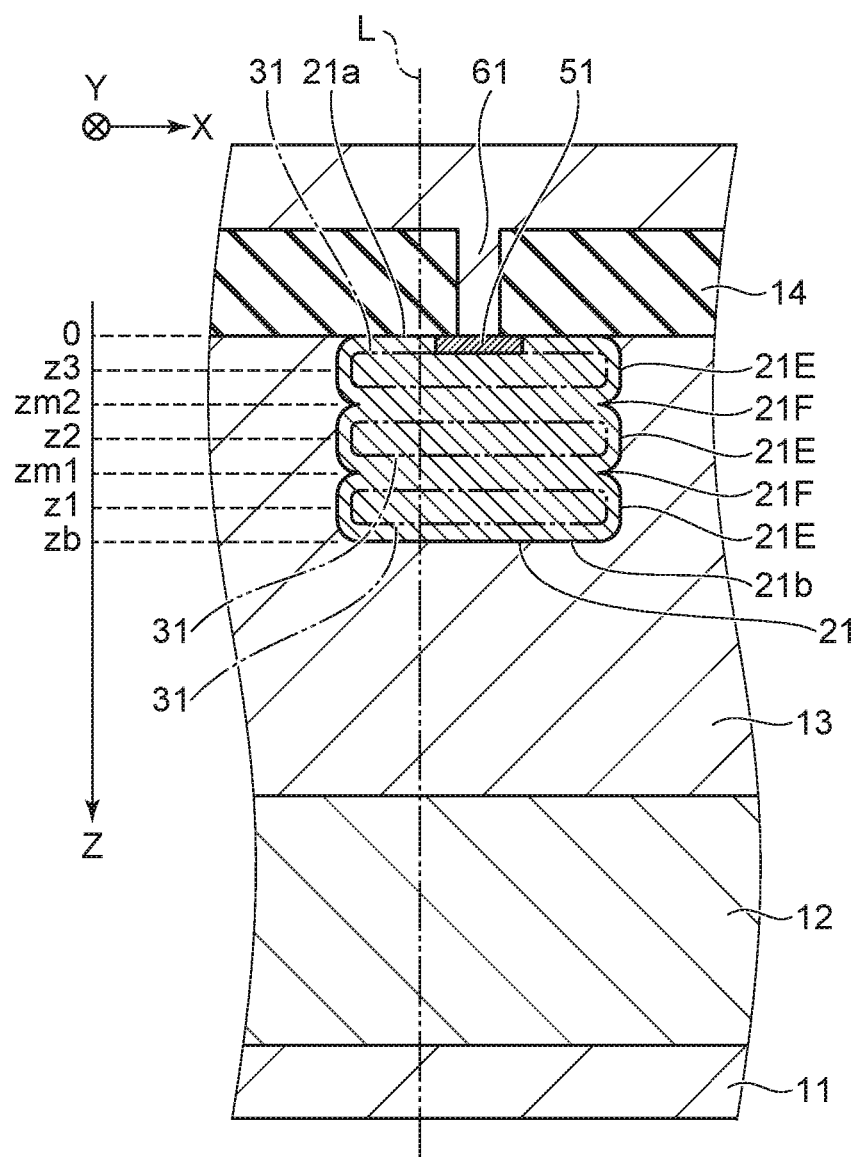
FIG. 3 is an enlarged cross-sectional view showing a second semiconductor layer of the first embodiment.
Figure 4:
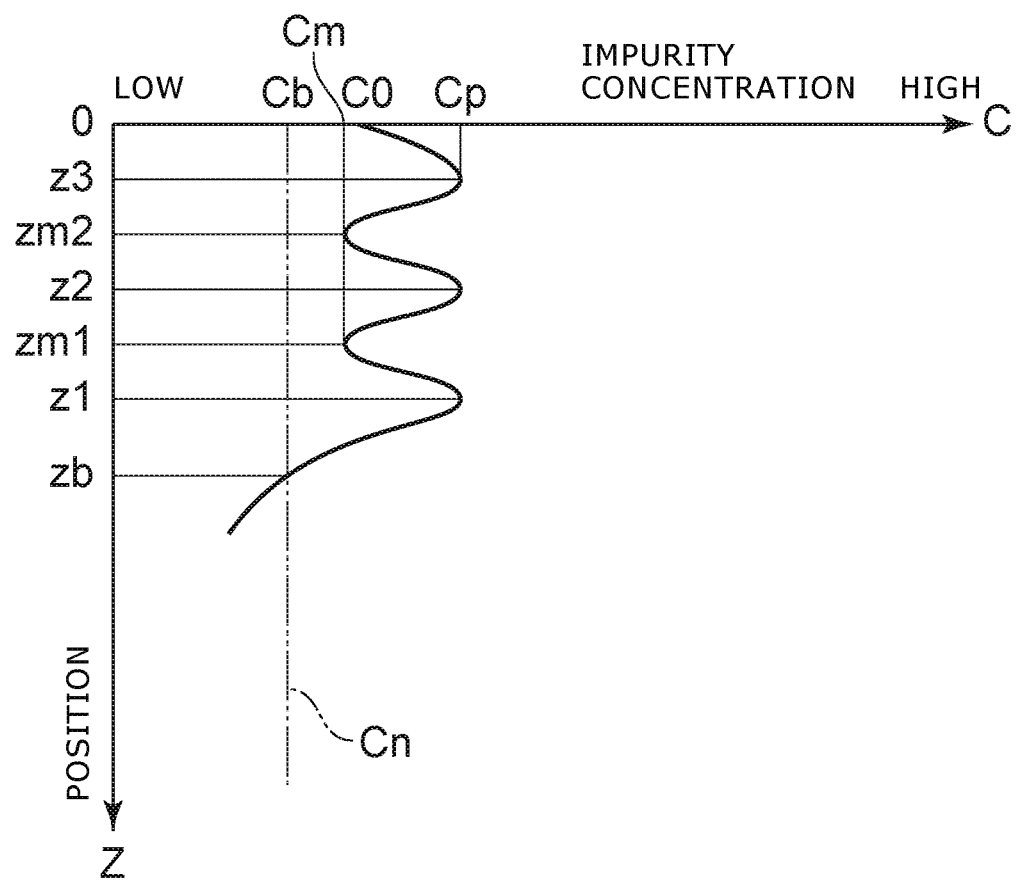
FIG. 4 is a graph showing an impurity concentration profile of the second semiconductor layer of the first embodiment, in which a vertical axis is a position in a vertical direction, and a horizontal axis is the impurity concentration.

FIG. 1 is a plan view showing the semiconductor device according to the embodiment. FIG. 2 is a cross-sectional view along line A-A' shown in FIG. 1. FIG. 3 is an enlarged cross-sectional view showing a second semiconductor layer of the embodiment. FIG. 4 is a graph showing an impurity concentration profile of the second semiconductor layer of the embodiment, in which the vertical axis is the position in the vertical direction, and the horizontal axis is the impurity concentration. FIG. 1 illustrates only one corner of the semiconductor device 100. The interconnect layers and the inter-layer insulating films that are provided at the upper surface of the semiconductor device are not illustrated in FIG. 1 and FIG. 2.

For example, the semiconductor device 100 according to the embodiment is used to control a current supplied to a vehicle such as a railway car, etc., and a voltage of several hundred V is applied to the semiconductor device 100. The semiconductor device 100 according to the embodiment is, for example, a semiconductor device having an IGBT structure that has good current switching and excellent breakdown voltage performance. In the semiconductor device 100, for example, a cell part CE that controls the inflow of current to a device mounted in the vehicle is set, and a terminal part EN1 that is provided at the periphery of the cell part CE is set.

As shown in FIG. 1 and FIG. 2, the semiconductor device 100 is a substantially rectangular parallelepiped made of an upper surface, a lower surface 100b, and four side surfaces 100c continuous with the upper surface and the lower surface 100b. The semiconductor device 100 has a stacked structure and includes, as a general configuration, a first electrode 11 exposed at the bottom surface, a lower layer semiconductor layer 12 provided on the first electrode 11, a first semiconductor layer 13 provided on the lower layer semiconductor layer 12, an insulating layer 14 formed above the first semiconductor layer 13, and multiple electrodes 16, 71a to 71e, and 78 provided on the insulating layer 14.

Although the direction from the first electrode 11 toward the insulating layer 14 is called "up" and the reverse direction is called "down" for convenience of description in the specification, these expressions are for convenience and are independent of the direction of gravity. The downward direction also is called a "Z-direction". As shown in FIG. 2, the direction toward the terminal part EN1 which is the arrangement direction of gate electrodes 15 and the emitter electrodes 16 separated from each other in the cell part CE is called an "X-direction", and a direction orthogonal to the Z-direction and the X-direction is called a "Y-direction".

The lower layer semiconductor layer 12 is made of, for example, a p-type semiconductor, and the first semiconductor layer 13 is made of, for example, an n-type semiconductor. The insulating layer 14 includes, for example, silicon oxide. The first electrode 11, the lower layer semiconductor layer 12, the first semiconductor layer 13, and the insulating layer 14 are layers formed over the entire region of the semiconductor device 100 when viewed from above, and are exposed at the side surfaces 100c. When viewed from above, the multiple electrodes 16, 71a to 71e, and 78 are formed in concentric frame-shaped configurations outward from the center of the semiconductor device 100.

The configuration of the cell part CE will now be described.

As shown in FIG. 1 and FIG. 2, the cell part CE when viewed from above is set at the central part of the semiconductor device 100, and the terminal part EN1 encloses the cell part CE. In the cell part CE, the lower layer semiconductor layer 12, the first semiconductor layer 13, a channel layer 17, an emitter layer 18a, an emitter contact layer 18b, the insulating layer 14, the gate electrode 15, the emitter electrode 16, a contact 19, and a gate insulating film 15a are provided to overlap on the first electrode 11.

The first electrode 11 is, for example, a collector electrode and is connected to, for example, the positive side of the power supply device. A prescribed voltage is applied to the gate electrode 15 to perform the current control of the cell part CE. The emitter electrode 16 is connected to the negative side of the power supply device. Also, the emitter electrode 16 is connected to the emitter contact layer 18b via the contact 19. For example, the emitter electrode 16 is formed to have a continuous body with the contact 19 and has the same potential applied.

The gate electrode 15 is provided to extend in the Z-direction in the first semiconductor layer 13, the channel layer 17, and the emitter layer 18a which are stacked; the upper end of the gate electrode 15 contacts the insulating layer 14; and a voltage is applied to the gate electrode 15 by another power supply. The gate insulating film 15a covers the gate electrode 15 and insulates the gate electrode 15 from the first semiconductor layer 13, the channel layer 17, and the emitter layer 18a.

The channel layer 17 is made of, for example, a p-type semiconductor, and the emitter layer 18a is made of, for example, an n-type semiconductor. The emitter contact layer 18b is made of, for example, a $p^+$-semiconductor and is provided to extend in the Z-direction in the channel layer 17 and the emitter layer 18a which are stacked. The emitter contact layer 18b and the gate electrode 15 are separated from each other in the X-direction.

Unlike the configuration described above, one or more of the gate electrode 15, the gate insulating film 15a, and the emitter contact layer 18b positioned at the outermost side are surrounded with a second semiconductor layer 21 positioned at the innermost side of the terminal part EN1 described below.

The configuration of the terminal part EN1 will now be described.

As shown in FIG. 1 and FIG. 2, the terminal part EN1 is at the outer side of the semiconductor device 100 when viewed from above. In the terminal part EN1, the lower layer semiconductor layer 12, the first semiconductor layer 13, multiple second semiconductor layers 21, a terminal semiconductor layer 28, the insulating layer 14, multiple second electrodes 71a to 71e (hereinbelow, also generally referred to as the second electrode 71), a terminal electrode 78, and multiple contacts 61 and 68 are provided on the first electrode 11. The multiple second semiconductor layers 21 and the terminal semiconductor layer 28 are provided in the upper portion of the first semiconductor layer 13. The terminal semiconductor layer 28 is disposed at the outermost side of the semiconductor device 100.

The second semiconductor layers 21 are impurity diffusion layers set in the terminal part EN1 and suppress the concentration of the electric field in the terminal part EN1 when the cell part CE is in the OFF-state. When viewed from above, the multiple second semiconductor layers 21 are formed in frame-shaped configurations disposed concentrically with the cell part CE at the center. The second semiconductor layers 21 are made of, for example, a p-type semiconductor and are provided in the upper portion of, for example, the n-type first semiconductor layer 13. The multiple second semiconductor layers 21 are separated from each other, and the first semiconductor layer 13 enters the gaps between the multiple second semiconductor layers 21. The upper surface of the first semiconductor layer 13 that enters the gaps of the second semiconductor layers 21 contacts the insulating layer 14. The second semiconductor layers 21 are provided under the insulating layer 14. High-concentration portions 51 are provided at upper surfaces 21a of the second semiconductor layers 21. The high-concentration portions 51 are made of, for example, a $p^+$-type semiconductor, and portions of the high-concentration portions 51 contact the contacts 61. The heights of the multiple second semiconductor layers 21 are substantially the same.

The multiple contacts 61 extend through the insulating layer 14 and are formed between the high-concentration portions 51 and the second electrodes 71a to 71e. The lower surfaces of the contacts 61 contact the high-concentration portions 51, the side surfaces of the contacts 61 contact the insulating layer 14, and the upper surfaces of the contacts 61 contact the second electrodes 71a to 71e. Specifically, the contacts 61 are formed to have continuous bodies with the second electrodes 71a to 71e. Thereby, the second semiconductor layers 21 are connected to the second electrodes 71a to 71e via the contacts 61. The second electrode 71a that is most proximate to the center is formed to have a continuous body with the emitter electrode 16 and has the same potential applied.

The conductivity type of the terminal semiconductor layer 28 is the $n^+$-type. The terminal semiconductor layer 28 is provided on the first semiconductor layer 13 at the side surfaces 100c of the semiconductor device 100 and contacts the insulating layer 14. The contact 68 is provided at the center of the upper surface of the terminal semiconductor layer 28, and the terminal electrode 78 is provided on the contact 68. The contact 68 extends through the insulating layer 14 and connects the terminal semiconductor layer 28 and the terminal electrode 78. Specifically, the contact 68 is formed to have a continuous body with the terminal electrode 78. Thereby, the terminal semiconductor layer 28 is connected to the terminal electrode 78 via the contact 68. The terminal electrode 78 is outward of the outermost second electrode 71e and is, for example, substantially equipotential to the first electrode 11. As described above, is possible to prevent the depletion aye reaching the side surface 100c which is the dicing surface.

The second semiconductor layers 21 will now be described in more detail.

As shown in FIG. 3, three bulges 21E and two narrow portions 21F are formed at the side portion of one second semiconductor layer 21. As described below, the positions of the Z-direction centers of the bulges 21E are positions z1, z2, and z3 of the centers of implantation portions 31 into which ions are implanted in a manufacturing process of the semiconductor device 100. The narrow portions 21F are formed at a position zm1 between the position z1 and the position z2 and at a position zm2 between the position z2 and the position z3. The narrow portion 21F at the position zm1 is a portion in which boron diffusing after being implanted to the position z1 and boron diffusing after being implanted to the position z2 exist. The narrow portion 21F at the position zm2 is a portion in which boron diffused after being implanted to the position z2 and boron diffused after being implanted to the position z3 exist. Although the widths of the three bulges 21E due to, for example, the lengths in the X-direction are formed to be substantially the same, the widths may be different.

FIG. 4 shows a concentration profile of boron in a cross section L shown in FIG. 3. In FIG. 4, an impurity concentration Cn of the first semiconductor layer 13 also is shown because boron is implanted into the first semiconductor layer 13 in which the impurity is distributed uniformly. The second semiconductor layer 21 is a portion where the boron concentration is greater than the impurity concentration Cn of the first semiconductor layer 13.

The concentration of impurity, for example boron, has local maximums of a concentration Cp at the positions z1, z2, and z3 which are the middle positions of the bulges 21E, the concentration decreases away from the positions z1, z2, and z3, and the impurity concentration has local minimums of a concentration Cm at the positions zm1 and zm2 of the narrow portions 21F. The concentration is a concentration C0 at a position 0 in the Z-direction of the upper surface 21a of the second semiconductor layer 21. The concentration is an impurity concentration Cb at a position zb of a lower surface 21b. Thus, the impurity concentration profile in the Z-direction of the second semiconductor layer 21 has three peaks.

The concentration at the position zb of the lower surface 21b of the second semiconductor layer 21 is the concentration Cb, and the impurity concentration at the position z1 at substantially the center of the bulge 21E next to the position zb has the local maximum of the concentration Cp.

Although the second semiconductor layer 21 includes the three bulges 21E and the two narrow portions 21F in the embodiment, the second semiconductor layer 21 is not limited thereto. For example, it is sufficient for one or more narrow portions 21F to be between two or more bulges 21E. The profile shown in FIG. 4 is an example; as long as the concentrations Cp at the positions z1, z2, and z3 are local maximums, the concentrations Cp may be different from each other; the concentrations Cm at the positions zm1 and zm2 also may be different from each other. The size relationship of the concentrations Cm, C0, and Cb is not limited to the description and is different according to the conditions of the ion implantation.

Operations of the embodiment will now be described.

First, the semiconductor device 100 according to the embodiment controls the flow of a current between the first electrode 11 and the emitter electrode 16 in the cell part CE by a voltage applied to the gate electrode 15. At this time, the concentration of an electric field in the first semiconductor layer 13 occurs in the terminal part EN1 when the current flowing in the cell part CE is blocked, but the second semiconductor layer 21 prevents breakdown by relaxing the concentration of the electric field. Specifically, in the terminal part EN1, the multiple second semiconductor layers 21 that are disposed from the cell part CE toward the side surface 100c cause the depletion layer generated in the first semiconductor layer 13 to occur along the lower surfaces 21b of the second semiconductor layers 21.

That is, the concentration of the electric field in the terminal part EN1 is prevented by the guard ring structure made of the second electrodes 71a to 71b that are disposed concentrically at the upper surface of the semiconductor device 100 and formed along the terminal part EN1, and the multiple second semiconductor layers 21 connected to the second electrodes 71a to 71b. Specifically, the second electrodes 71b to 71e and the multiple second semiconductor layers 21 connected to the second electrodes 71b to 71e are electrically floating and relax the curvature of the depletion layer under the second semiconductor layers 21 by extending the depletion layer outward. Also, the same potential is applied to the second electrode 71a formed to have a continuous body with the emitter electrode 16 and to the second semiconductor layer 21 connected to the second electrode 71a. Thus, the breakdown voltage is maintained by suppressing the concentration of the electric field in the terminal part EN1.

The three peaks at z1, z2, and z3 are formed in the profile of the impurity concentration of the second semiconductor layer 21 relating to the Z-direction. Thereby, the lower surface 21b of the second semiconductor layer 21 is formed by diffusion of the boron ion-implanted to the position z1 and is proximate to the high-concentration portion having the high concentration Cp positioned at z1. Thereby, when blocking the current of the cell part CE, the removal resistance of holes at the junction at the lower surface 21b is reduced.

A method for manufacturing the terminal part EN1 of the semiconductor device 100 according to the embodiment will now be described. FIGS. 5A and 5B and FIGS. 6A and 6B are cross-sectional views showing processes after the ion implantation in the embodiment.

Figure 5A:
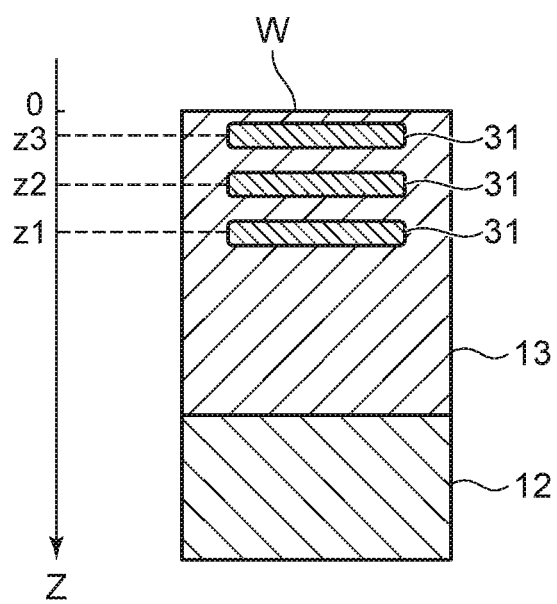
FIGS. 5A to 6B are cross-sectional views showing processes after an ion implantation in the first embodiment.

As shown in FIG. 5A, a wafer W is prepared in which the p-type lower layer semiconductor layer 12 is formed, and, for example, the n-type first semiconductor layer 13 is formed on the lower layer semiconductor layer 12. The implantation portions 31 are formed at the prescribed locations of the positions z1, z2, and z3 in the first semiconductor layer 13 of the wafer W by ion-implanting an impurity, e.g., boron. The ion implantation implants boron in the order of the positions z1, z2, and z3. The ion implantation is performed using the implantation conditions of a highest acceleration energy Ev1 (key) for the implantation portion 31 positioned at the lowermost z1, an acceleration energy Ev2 (key) less than Ev1 for the implantation portion 31 positioned at z2 above z1, and a lowest acceleration energy Ev3 (kV) for the implantation portion 31 positioned at the uppermost z3. After the ion implantation, the implanted impurity is activated by performing heat treatment. At this time, the impurity is activated and slightly diffused. The heat treatment is performed at a low temperature for a short period of time compared to a conventional heat treatment having a main object of diffusing the impurity.

Figure 5B:
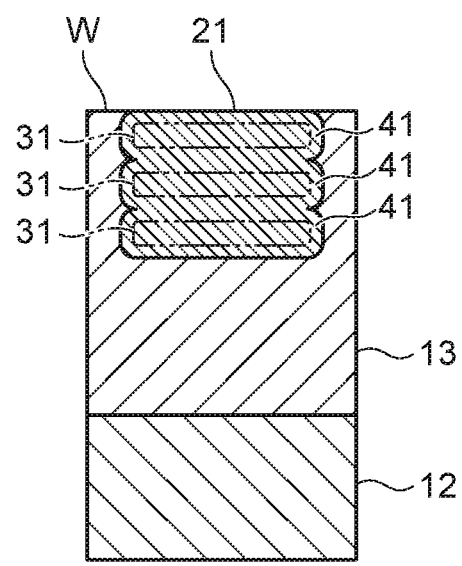

As shown in FIG. 5B, multiple diffusion portions 41 that are diffused slightly from the multiple implantation portions 31 by the heat treatment are formed, and the second semiconductor layer 21 is formed of the implantation portions 31 and the diffusion portions 41. The three implantation portions 31 are separated in the Z-direction which is the vertical direction, and have their Z-direction centers at the positions z1, z2, and z3. The implantation portions 31 are formed in frame-shaped configurations having substantially the same width and substantially the same Z-direction thickness by ion implantation in which, for example, boron is implanted; however, this configuration is an example, and mutually-different widths and thicknesses may be set.

The diffusion portions 41 are portions into which some of the boron implanted into the implantation portions 31 diffuses. The diffusion portions 41 are formed by diffusing from the implantation portions 31. The diffusion portion 41 mixes with the other diffusion portions 41 adjacent above and below at the positions zm1 and zm2.

The bulge 21E that is positioned at the lowermost layer (referring to FIG. 3) includes the implantation portion 31 and the diffusion portion 41.

Figure 6A:
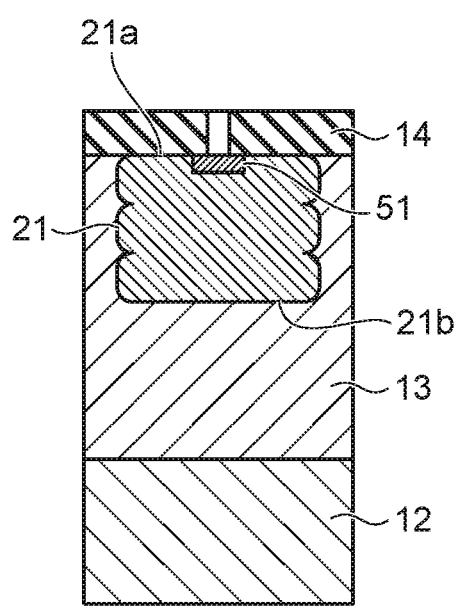

As shown in FIG. 6A, the insulating layer 14 is formed at the upper surface of the wafer W, and an opening is formed by removing the insulating layer 14 above the upper surface 21a by etching. Then, the high-concentration portion 51 is formed at the center of the upper surface 21a of the second semiconductor layers 21 by ion-implanting an impurity, e.g., boron.

Figure 6B:
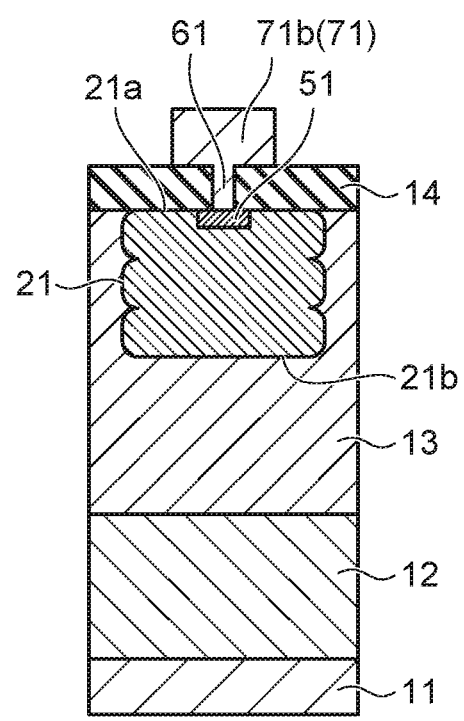

Then, as shown in FIG. 6B, the contacts 61 and 68, the second electrodes 71, and the terminal electrode 78 are formed by depositing by, for example, sputtering a metal such as, for example, aluminum, etc. The first electrode 11 is formed at the lower surface 100b of the semiconductor device 100.

Although the regions into which the impurity is ion-implanted are set to the three locations of z1, z2, and z3 separated in the Z-direction and the three peaks in the impurity concentration profile relating to the vertical direction are provided in the embodiment, the regions are not limited thereto. It is sufficient for the ion implantation regions to be at two or more locations in the Z-direction.

Effects of the semiconductor device according to the embodiment will now be described.

According to the semiconductor device 100 according to the embodiment, the second semiconductor layer 21 is formed by implanting an impurity by multiple ion implantations having mutually-different acceleration voltages, and multiple peaks are provided in the profile of the impurity concentration in the vertical direction of the second semiconductor layer 21. Thereby, the multiple bulges 21E and one or more narrow portions 21F are formed in the cross-sectional configuration of the second semiconductor layer 21, and the impurity concentration at the lower surface 21b side of the second semiconductor layer 21 is high compared to the impurity concentration at a lower surface 29b side of a second semiconductor layer 29 of a comparative example described below. Accordingly, the holes at the lower surface 21b of the second semiconductor layer 21 in the OFF-state of the cell part CE can be ejected quickly. As a result, the breakdown of the terminal part EN1 can be suppressed.

Also, in the lowermost bulge 21E, the implantation portion 31 that has a high boron concentration is covered with the diffusion portion 41. Thereby, the impurity concentration at the lower surface 21b side of the second semiconductor layer 21 is high compared to the impurity concentration at the lower surface 29b side of the second semiconductor layer 29 of the comparative example described below, and the holes at the lower surface 21b are ejected more easily.

The cell part CE and the terminal part EN1 of the embodiment are not limited to the structures recited above as long as the second semiconductor layer 21 having a similar structure can be utilized. For example, the semiconductor device is not limited to a semiconductor device having an IGBT structure; a structure such as a MOSFET, a FRD, etc., may be used in the semiconductor device.

Although the terminal part EN1 has a guard ring structure in the embodiment, another terminal structure including a terminal diffusion layer may be used. For example, another terminal structure such as a field plate structure, a VLD (Variation of Lateral doping) structure, etc., may be used in the terminal part EN1, Although five second electrodes 71a to 71e and five second semiconductor layers 21 are provided in the embodiment, the numbers are not limited thereto.

Comparative Example

A semiconductor device 109 according to a comparative example will now be described. The semiconductor device 109 includes the second semiconductor layer 29.

Figure 7:
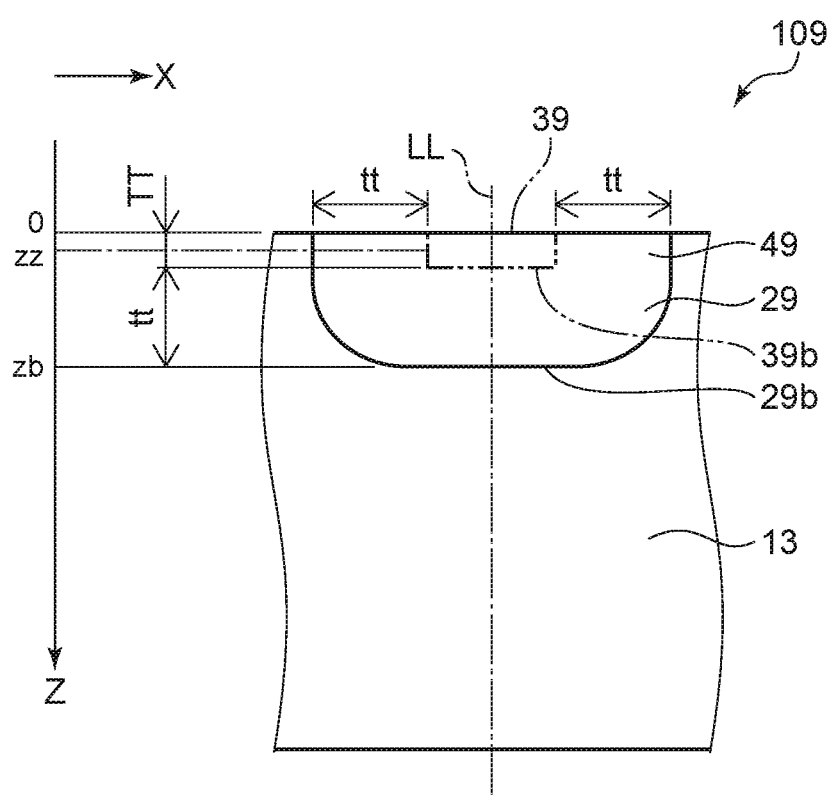
FIG. 7 is a cross-sectional view showing a second semiconductor layer of a comparative example.
Figure 8:
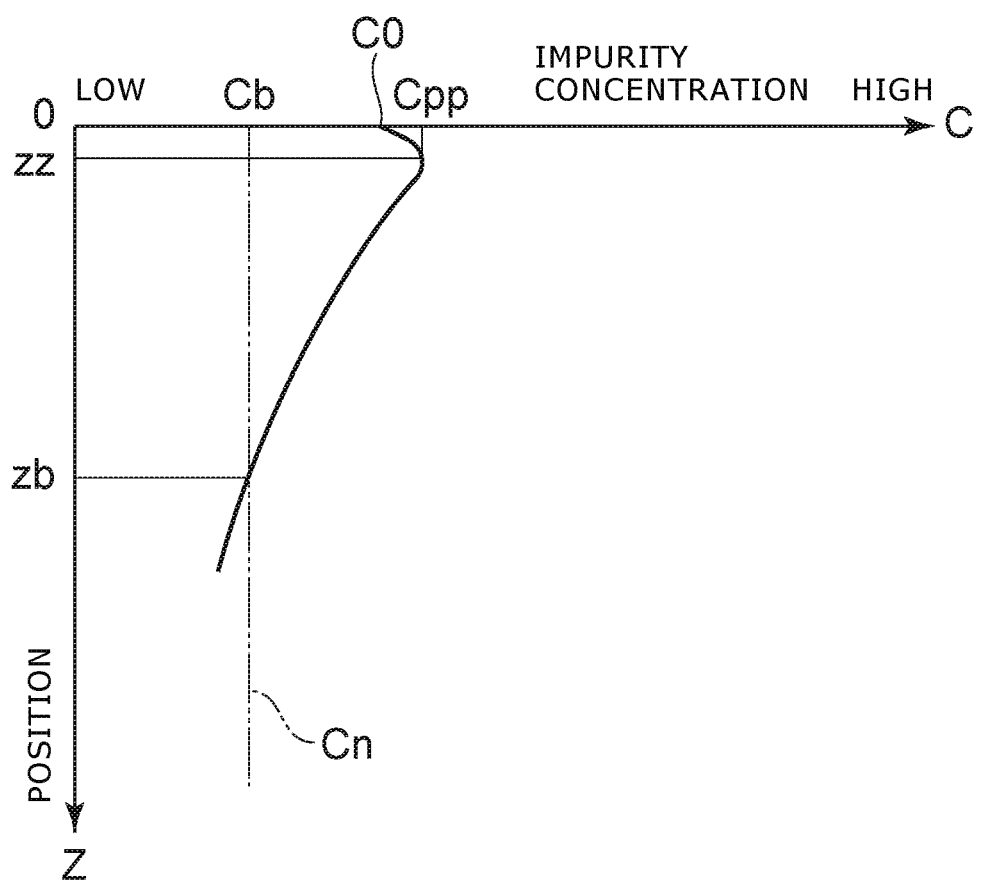
FIG. 8 is a graph showing an impurity concentration profile in a vertical direction of the second semiconductor layer of the comparative example, in which a vertical axis is a position in a vertical direction, and a horizontal axis is an impurity concentration.

FIG. 7 is a cross-sectional view showing the second semiconductor layer of the comparative example and shows only the second semiconductor layer 29 and the first semiconductor layer 13. FIG. 8 is a graph showing the impurity concentration profile in the vertical direction of the second semiconductor layer of the comparative example, in which the vertical axis is the position in the vertical direction, and the horizontal axis is the impurity concentration. Specifically, FIG. 8 is the profile along a cross-section line LL shown in FIG. 7.

As shown in FIG. 7, the cross-sectional configuration of the second semiconductor layer 29 is substantially half-oval-shaped. The second semiconductor layer 29 is formed from one implantation portion 39, and a diffusion portion 49 formed by diffusing from the implantation portion 39. The implantation portion 39 is formed by one ion implantation of boron centered at a position zz proximate to the upper surface of the first semiconductor layer 13. The thickness in the Z-direction of the implantation portion 39 is TT. The second semiconductor layer 29 is formed by widely diffusing the impurity by heating at a higher temperature for a longer period of time compared to the heat treatment of the first embodiment described above. Accordingly, in the second semiconductor layer 29, the diffusion portion 49 is large compared to the implantation portion 39 and spreads a thickness tt from the implantation portion 39. The thickness tt is drastically greater than the thickness TT and is drastically greater than the thickness of the first embodiment. The distance between the lower surface 29b of the second semiconductor layer 29 and a lower surface 39b of the implantation portion 39 is the thickness tt. The position in the Z-direction of the lower surface 29b is zb, and the position in the Z-direction of an upper surface 29a is 0.

As shown in FIG. 8, the impurity concentration profile in the Z-direction of the second semiconductor layer 29 has a highest concentration Cpp at the position zz proximate to the upper surface 29a, and has a lowest concentration Cb at the lower surface 29b at the position zb. Accordingly, the impurity concentration decreases gradually from the highest concentration Cpp at the position zz to the concentration Cb at the position zb. In the comparative example, the length between the position zz of the highest concentration and the position zb of the lower surface 29b is greater than the length between the lower surface 21b and the position z1 of a local maximum in the first embodiment. Accordingly, in the comparative example, the ejection of the holes at the lower surface 29b in the OFF-state of the cell part CE is slow.

Second Embodiment

In a terminal part EN2 of the embodiment, a second semiconductor layer 22 that includes multiple partial semiconductor layers arranged in the Z-direction is provided.

Figure 9:
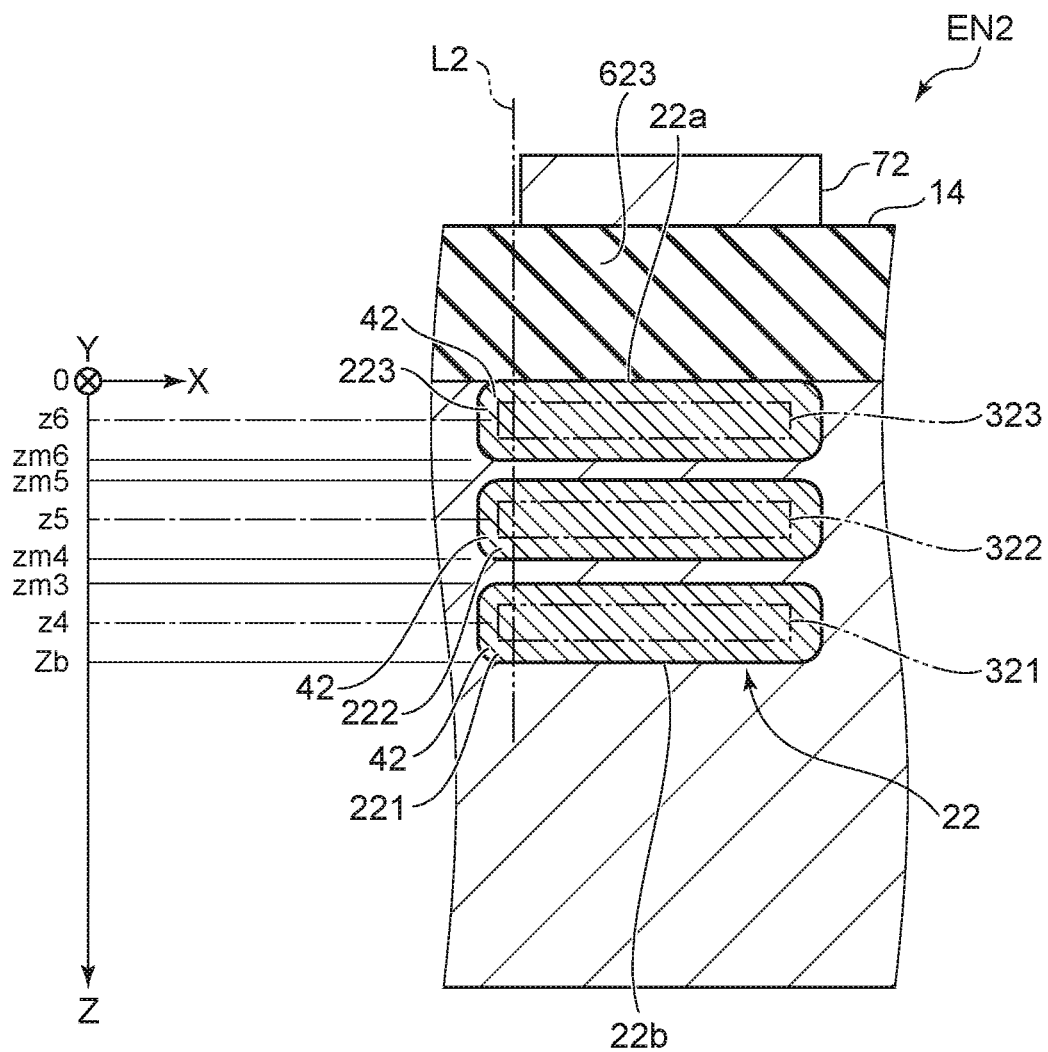
FIG. 9 is a cross-sectional view showing a second semiconductor layer of a second embodiment.
Figure 10:
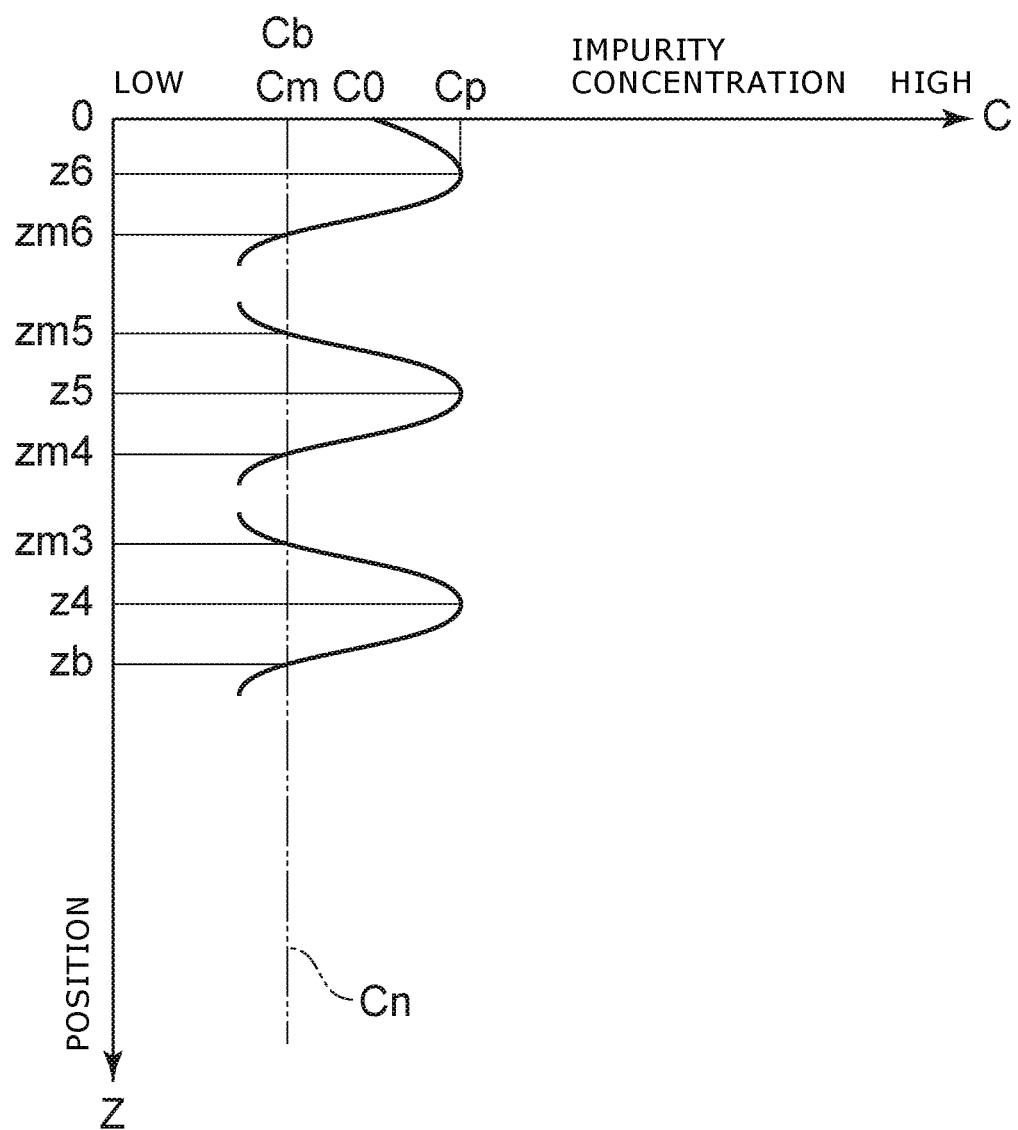
FIG. 10 is a graph showing an impurity concentration profile of the second semiconductor layer of the second embodiment, in which a vertical axis is a position in the vertical direction, and a horizontal axis is the impurity concentration.
Figure 11:
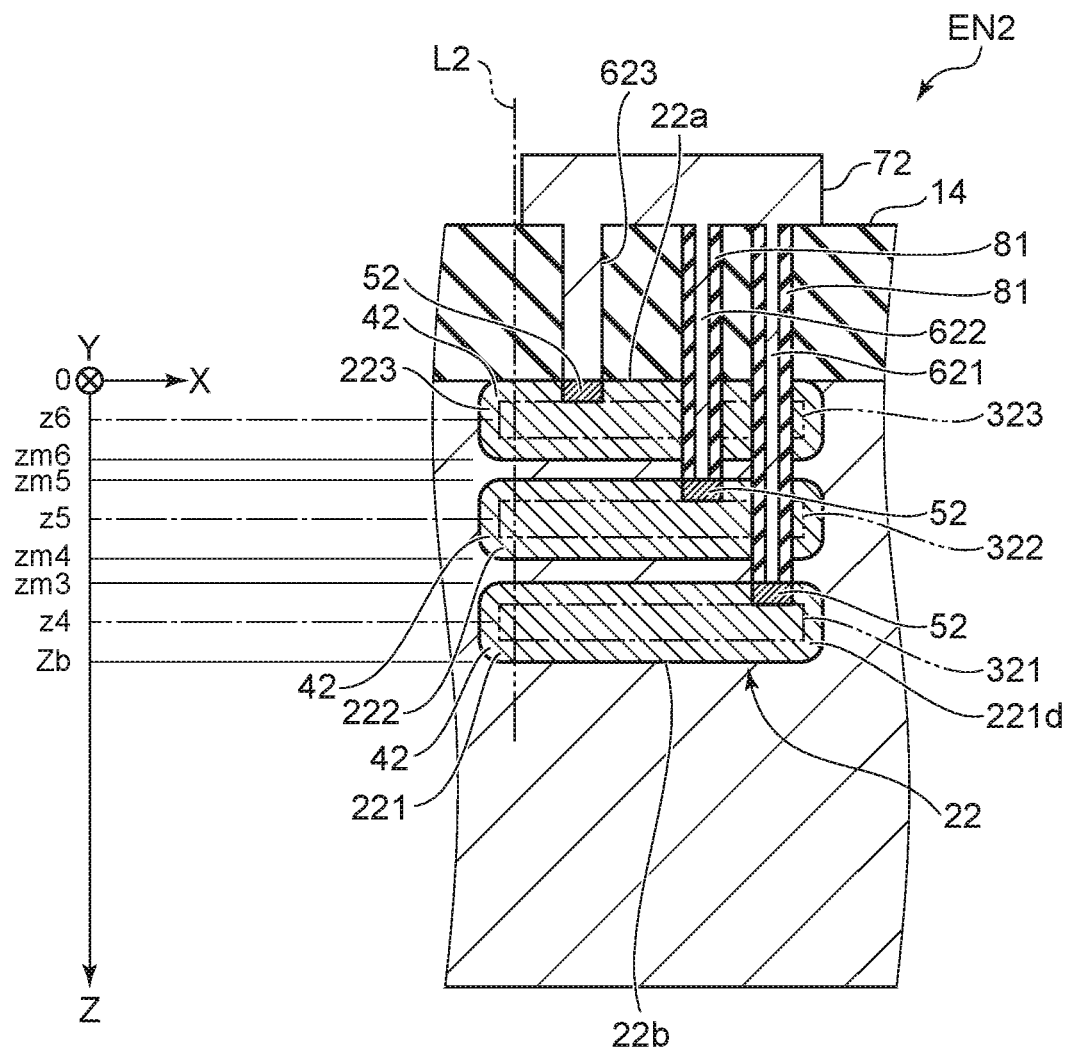
FIG. 11 is a cross-sectional view showing connection locations of the second semiconductor layer and contacts of the second embodiment.

FIG. 9 is a cross-sectional view showing the second semiconductor layer of the embodiment. FIG. 10 is a graph showing the impurity concentration profile in the vertical direction of the second semiconductor layer along a cross-section line L2 shown in FIG. 9. FIG. 11 is a cross-sectional view showing the connection locations of the second semiconductor layer and the contacts of the embodiment. Although one second semiconductor layer 22 that is divided into a plurality in the Z-direction is shown in FIG. 9 and FIG. 11, the multiple second semiconductor layers 22 are provided in the X-direction similarly to the first embodiment. The first electrode 11 and the lower layer semiconductor layer 12 that are provided at the lower surface of the semiconductor device are not illustrated in FIG. 9 and FIG. 11.

As shown in FIG. 9, the second semiconductor layer 22 that includes multiple partial semiconductor layers 221, 222, and 223 separated in the Z-direction, contacts 621 to 623 that connect a second electrode 72 and the multiple partial semiconductor layers 221 to 223, and silicon oxide films 81 that cover portions of the contacts 621 and 622 are provided in the terminal part EN2 of the semiconductor device 100 according to the embodiment. The partial semiconductor layers 221 to 223 are provided in the upper portion of the first semiconductor layer 13.

The partial semiconductor layers 221 to 223 are separated in the Z-direction, and the first semiconductor layer 13 is interposed in the gaps. As shown in FIG. 9, the partial semiconductor layers 221 to 223 are formed in frame-shaped configurations when viewed from above, and widths of the frames due to, for example, the X-direction lengths are substantially the same. The widths of the partial semiconductor layers 221 to 223 may be different from each other.

The partial semiconductor layer 221 is disposed in the lowermost layer in the Z-direction. The partial semiconductor layer 222 is disposed on the partial semiconductor layer 221. The partial semiconductor layer 223 is disposed on the partial semiconductor layer 222.

The partial semiconductor layers 221 to 223 are configured by boron being implanted by ion implantation. The first semiconductor layer 13 is interposed in gaps in the Z-direction of the partial semiconductor layers 221 to 223. The partial semiconductor layers 221 and 222 are surrounded with the first semiconductor layer 13. The partial semiconductor layer 223 contacts the insulating layer 14 at an upper surface 22a; otherwise, the partial semiconductor layer 223 contacts the first semiconductor layer 13.

As shown in FIG. 10, the profile of the boron concentration in the Z-direction of the second semiconductor layer 22 has the local maximums of the concentration Cp at positions z4, z5, and z6 at substantially the centers of the partial semiconductor layers 221 to 223. The concentration decreases away from the positions z4, z5, and z6 and has the concentration Cm that is less than the concentration Cp at a position zm3, zm4, zm5, and zm6. The concentration is the concentration Cb that is substantially equal to the concentration Cm at the position zb of a lower surface 22b and is the concentration C0 that is less than the concentration Cp at the position 0 of the upper surface 22a. Although the boron diffuses also between the position zm3 and the position zm4 and between the position zm5 and the position zm6, these regions are considered to be the n-type first semiconductor layer 13 because the concentrations are less than the impurity concentration Cn of the first semiconductor layer 13. Thus, three peaks having the concentration Cp are included in the impurity concentration profile in the Z-direction of the second semiconductor layer 22. The profile shown in FIG. 10 is an example; the concentrations Cp at the positions z4, z5, and z6 may be different from each other as long as the concentrations Cp are local maximums.

FIG. 11 is a cross-sectional view along center lines of the contacts 621 to 623 that are provided partially. In the embodiment, the contacts 621 to 623 are connected to the corresponding partial semiconductor layers 221 to 223 respectively at least at one location each. Thus, the contacts 621 to 623 are provided at locations that appear in the same cross section in the embodiment; however, the contacts 621 to 623 may be provided at locations that do not appear in the same cross section.

Multiple high-concentration portions 52 are formed inside the partial semiconductor layers 221 to 223. The contacts 621, 622, and 623 are formed to extend in the Z-direction; the lower ends of the contacts 621, 622, and 623 are provided on the high-concentration portions 52 of the partial semiconductor layers 221 to 223; and the upper ends of the contacts 621, 622, and 623 are connected to the second electrode 72. Thereby, the contacts 621 to 623 respectively connect the second electrode 72 and the partial semiconductor layers 221 to 223 by being shifted in the X-direction when viewed from above. Although the contacts are shifted in the X-direction in the embodiment, the contacts also may be shifted in the Y-direction; in such a case, the contacts may not be shifted in the X-direction.

As shown in FIG. 11, the contacts 621 and 622 extend through the first semiconductor layer 13, and the side surfaces of the contacts 621 and 622 are covered with the silicon oxide film 81. The silicon oxide film 81 is an insulating film including silicon oxide ($SiO_2$). Thereby, the contacts 621 and 622 are insulated from the first semiconductor layer 13 because the silicon oxide film 81 is provided between the first semiconductor layer 13 and the contact 621 and between the first semiconductor layer 13 and the contact 622.

Although the second semiconductor layer 22 includes the partial semiconductor layers 221 to 223 separated in the Z-direction in the embodiment, it is sufficient for two or more partial semiconductor layers to be included.

Operations of the embodiment will now be described.

The lower surface 22b of the second semiconductor layer 22 according to the embodiment is proximate to a high-concentration portion having the concentration Cp at the position z4. Thereby, the holes at the lower surface 22b in the OFF-state of the cell part CE are ejected quickly. Also, the contacts 621 and 622 that are connected to the partial semiconductor layers 221 and 222 are insulated from the first semiconductor layer 13 by being covered with the silicon oxide film 81. Thereby, the contacts 621 and 622 connect the second electrode 72 and the partial semiconductor layers 221 and 222.

A method for manufacturing the second semiconductor layer 22 according to the embodiment will now be described.

Similarly to the first embodiment, ion implantation is performed into implantation portions 321 to 323 of the wafer in the order of the implantation portion 321 at the lowest position z4 to the implantation portion 323 at the highest position z6; similarly to the first embodiment, the partial semiconductor layers 221 to 223 are formed by heat treatment. Thereby, the partial semiconductor layers 221 to 223 include the implantation portions 321 to 323 into which boron is implanted by ion implantation, and diffusion portions 42 into which the boron diffuses from the implantation portions 321 to 323.

Similarly to the partial semiconductor layers 221 to 223, the implantation portions 321 to 323 are formed to have substantially the same width. Although the widths are substantially equivalent in the embodiment, there also may be cases where the widths of the partial semiconductor layers 221 to 223 are different. The implantation portions 321 to 323 are formed by implanting an impurity by ion implantation centered at the positions z4, z5, and z6 in the Z-direction. The diffusion portions 42 are formed by the diffusion from the implantation portions 32 by the heat treatment and surround the implantation portions 32. Then, the insulating layer 14 is formed at the upper surface of the wafer.

Then, the high-concentration portions 52 are formed in the partial semiconductor layers 221 to 223 by forming openings by removing the insulating layer 14 and the first semiconductor layer 13 positioned at the upper surface 22a and the upper ends of the partial semiconductor layers 221 and 222 in the cross-sectional location shown in FIG. 11 by etching. The silicon oxide film 81 is formed at the inner surfaces of the openings in which the contacts 621 and 622 are disposed. The contacts 621 to 623 are formed respectively in the through-holes.

Effects of the embodiment will now be described.

According to the second semiconductor layer 22 of the embodiment, multiple peaks are provided in the profile of the impurity concentration in the Z-direction of the second semiconductor layer 22 by forming the separated multiple partial semiconductor layers 221 to 223 by performing ion implantation into multiple locations separated in the Z-direction. The impurity concentration at the lower surface 22b side of the second semiconductor layer 22 is high. Accordingly, the holes at the lower surface 22b of the second semiconductor layer 22 in the OFF-state of the cell part CE can be ejected quickly, and the breakdown of the terminal part EN2 can be suppressed.

Because the contacts 621 and 622 of the embodiment are insulated from the first semiconductor layer 13 by being covered with the silicon oxide film 81, an electrical connection to the first semiconductor layer 13 can be prevented, and the second electrode 72 and the partial semiconductor layers 221 and 222 can be connected. Thereby, the curvature of the depletion layer of the terminal part EN2 can be relaxed, a high electric field intensity can be suppressed, and the breakdown of the terminal part EN2 can be prevented.

Otherwise, the configuration, the operations, and the effects of the embodiment are similar to those of the first embodiment.

First Modification of Second Embodiment

Figure 12:
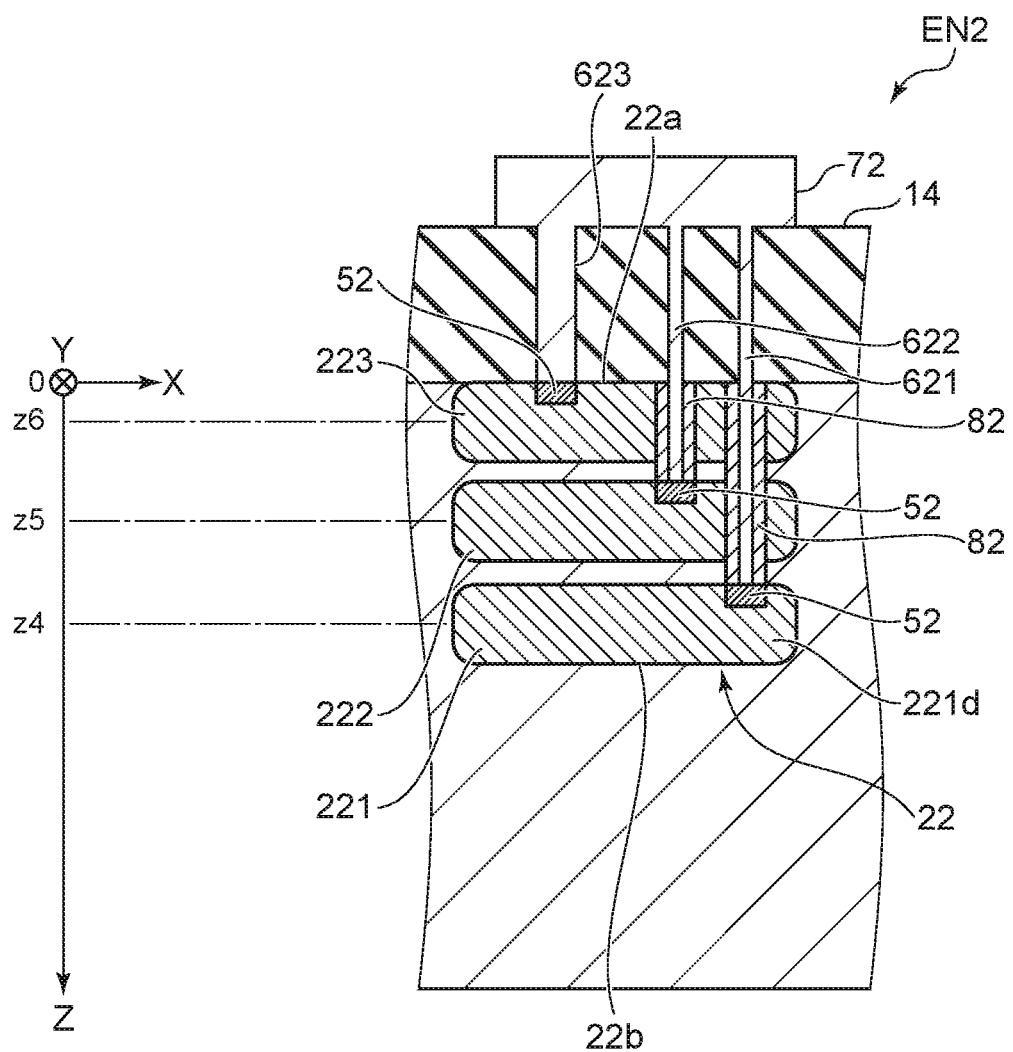
FIG. 12 is a cross-sectional view showing connection locations of a second semiconductor layer and contacts in a first modification of the second embodiment.

In the modification, portions of the contacts 621 and 622 in the terminal part EN2 are covered with $p^+$-type semiconductor layers 82. FIG. 12 is a cross-sectional view showing connection locations of the second semiconductor layer and the contacts in the modification. The contacts 621 and 622 that are formed in the cross-sectional portion shown in FIG. 12 extend through the first semiconductor layer 13; the side surfaces of the portions of the contacts 621 and 622 contacting the first semiconductor layer 13 are covered with the $p^+$-type semiconductor layers 82; and the side surfaces of the portions of the contacts 621 and 622 contacting the insulating layer 14 are not covered with the $p^+$-type semiconductor layers 82.

For example, the $p^+$-type semiconductor layer 82 is made of a p-type semiconductor including a higher concentration than the second semiconductor layer 21. A p-n interface is formed between the $p^+$-type semiconductor layer 82 and the first semiconductor layer 13 which is of the n-conductivity type. When the potential applied to the $p^+$-type semiconductor layer 82 is less than the potential applied to the first semiconductor layer 13, the first semiconductor layer 13 and the $p^+$-type semiconductor layer 82 are insulated from each other by a depletion layer spreads from the starting point of the p-n interface between the first semiconductor layer 13 and the $p^+$-type semiconductor layer 82. Thereby, the contacts 621 and 622 are insulated from the first semiconductor layer 13. The partial semiconductor layers 221 and 222 that are surrounded with the first semiconductor layer 13 are connected to the second electrode 72 via the contacts 621 and 622 insulated from the first semiconductor layer 13 by being covered with the $p^+$-type semiconductor layer 82, and applied stable potential.

The $p^+$-type semiconductor layer 82 is formed in a hollow configuration from a $p^+$-type semiconductor including a high concentration of boron contacting silicon at a portion of the inner surface of an opening formed by etching above the high-concentration portion 52. For example, the $p^+$-type semiconductor layer 82 is formed by ion implantation. Subsequently, the contacts 621 to 623 are formed.

According to the contacts 621 and 622 and the $p^+$-type semiconductor layers 82 of the modification, the partial semiconductor layers 221 and 222 that are disposed in the lower layers and surrounded with the first semiconductor layer 13 are electrically connected to the second electrode 72 via the contacts 621 and 622 and can be prevented from electrically connecting to the first semiconductor layer 13. The concentration of the electric field at the lower surface 22b side of the second semiconductor layer 22 of the terminal part EN2 is suppressed thereby.

Otherwise, the configuration, the operations, and the effects of the embodiment are similar to those of the second embodiment.

Second Modification of Second Embodiment

In the modification, portions of the contacts 621 and 622 in the terminal part EN2 are covered with metal films 83.

Figure 13:
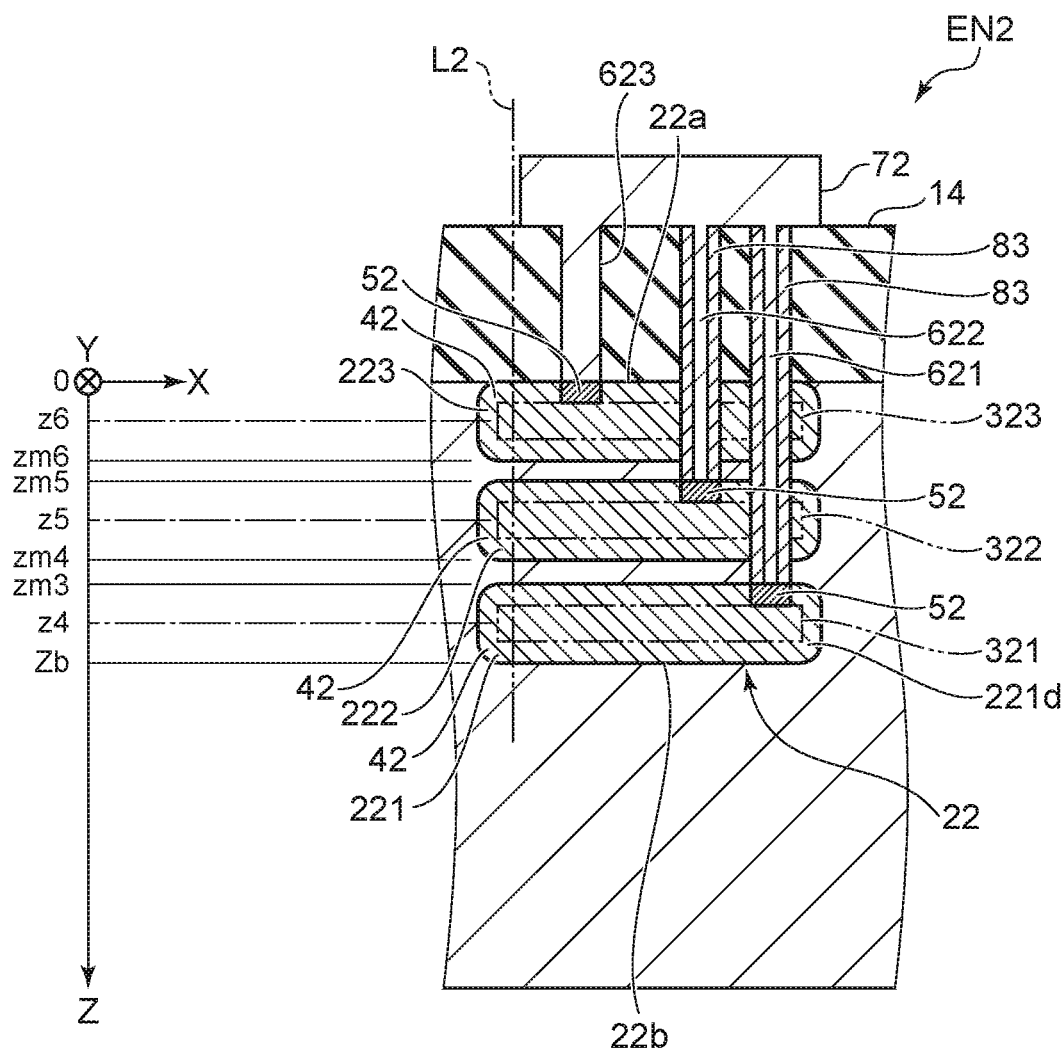
FIG. 13 is a cross-sectional view showing connection locations of a second semiconductor layer and contacts in a second modification of the second embodiment.

FIG. 13 is a cross-sectional view showing connection locations of the second semiconductor layer and the contacts in the modification. The contacts 621 and 622 that are formed in the cross-sectional portion shown in FIG. 13 extend through the first semiconductor layer 13, and the side surfaces of the contacts 621 and 622 are covered with the metal films 83.

The metal films 83 cover the side surfaces of the contacts 621 and 622 and are provided between the first semiconductor layer 13 and the contacts 621 and 622. The metal film 83 is formed of a metal forming a Schottky barrier with the first semiconductor layer 13 which has an n-conductivity type, and the metal film 83 is formed from, for example, at least one type of metal selected from the group consisting of aluminum, tantalum, silver, molybdenum, tungsten, cobalt, chrome, ruthenium, gold, palladium, nickel, and platinum. Thereby, when a voltage is applied between the first electrode 11 and the second electrode 72 so that the first electrode 11 is positive and the second electrode 72 is negative, a negative potential with respect to the first semiconductor layer 13 is applied to the metal film 83; therefore, the interface between the metal film 83 and the first semiconductor layer 13 functions as a Schottky barrier, and the current that flows from the first semiconductor layer 13 to the metal film 83 is inhibited. Thereby, the contacts 621 and 622 are insulated from the first semiconductor layer 13. Accordingly, the contacts 621 and 622 can electrically connect the second electrode 72 and the partial semiconductor layers 221 and 222 in a state in which electrical connections to the first semiconductor layer 13 are prevented.

The contacts 621 and 622 and the metal films 83 of the modification are formed by, for example, sputtering the metal film 83 onto the inner surfaces of openings formed by removing the first semiconductor layer 13 and the insulating layer 14 by etching, by forming the contacts 621 and 622 at the inner sides of the metal films 83, and by forming the contact 623 and the second electrode 72. The metal film 83 may be formed also at the side surface of the contact 623 and/or the lower portion of the second electrode 72.

According to the contacts 621 and 622 and the metal films 83 of the modification, the interfaces between the first semiconductor layer 13 and the metal films 83 function as Schottky barriers, and the contacts 621 and 622 are insulated from the first semiconductor layer 13. Thereby, the partial semiconductor layers 221 and 222 that are surrounded with the first semiconductor layer 13 are electrically connected to the second electrode 72 via the contacts 621 and 622 in a state in which electrical connections to the first semiconductor layer 13 are prevented. Thereby, the curvature of the depletion layer of the terminal part EN2 is relaxed, and a high electric field intensity is suppressed.

Otherwise, the configuration, the operations, and the effects of the embodiment are similar to those of the second embodiment.

Third Embodiment

A second semiconductor layer 23 of the embodiment is surrounded with the first semiconductor layer 13, one second semiconductor layer 23 is provided in the Z-direction, and a contact 63 is covered with the silicon oxide film 81.

Figure 14:
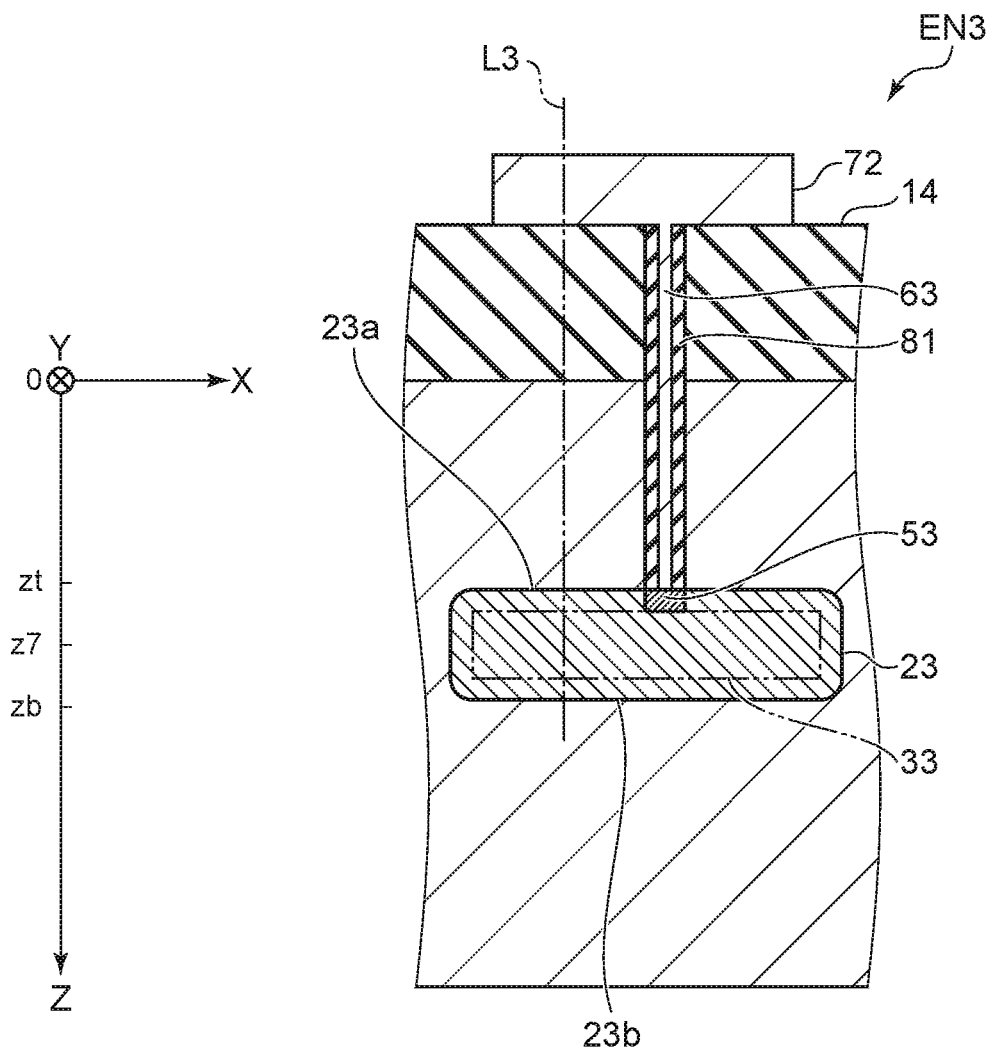
FIG. 14 is a cross-sectional view showing connection location of the contact and the second semiconductor layer of a third embodiment.
Figure 15:
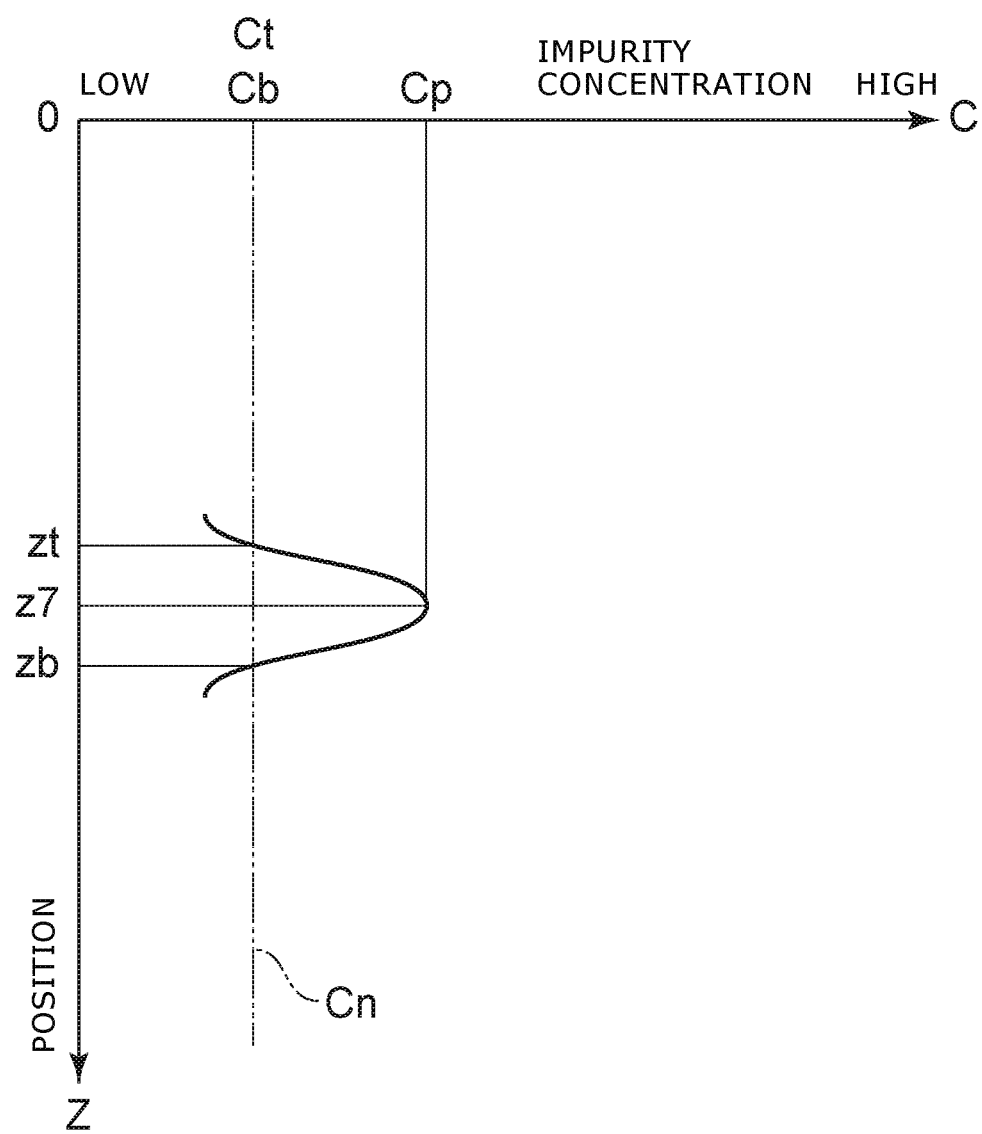
FIG. 15 is a graph showing an impurity concentration profile of the second semiconductor layer of the third embodiment, in which a vertical axis is a position in a vertical direction, and a horizontal axis is the impurity concentration.

FIG. 14 is a cross-sectional view showing the connection location of the contact and the second semiconductor layer of the embodiment. FIG. 15 is a graph showing the impurity concentration profile in the vertical direction of the second semiconductor layer along a cross-section line L3 shown in FIG. 14, in which the vertical axis is the position in the vertical direction, and the horizontal axis is the impurity concentration. The first electrode 11 and the lower layer semiconductor layer 12 that are provided at the lower surface of the semiconductor device are not illustrated in FIG. 14.

Although one second semiconductor layer 23 is formed in the Z-direction in the embodiment, multiple second semiconductor layers 23 may be formed.

As shown in FIG. 14, the second semiconductor layer 23 is separated from the upper surface of the first semiconductor layer 13 and surrounded with the first semiconductor layer 13. The second semiconductor layer 23 is formed by forming an implantation portion 33 at a position z7 in the Z-direction by ion-implanting boron with a high acceleration energy and by activating and slightly diffusing by performing heat treatment.

In the profile of the boron concentration in the Z-direction of the second semiconductor layer 23 as shown in FIG. 15, the highest concentration Cp is at the central position z7 of the implantation portion 33, and the boron concentration decreases away from the position z7. Thereby, the second semiconductor layer 23 is formed below the first semiconductor layer 13. Also, the second semiconductor layer 23 is formed by slight diffusion due to heat treatment having the main object of activating. Thus, the impurity concentration at a lower surface 23b of the second semiconductor layer 23 can be high, and the holes in the OFF-state of the cell part CE can be ejected quickly.

Similarly to the second embodiment, the contact 63 is formed partially at the cross-sectional location shown in FIG. 14. The contact 63 extends in the Z-direction through the first semiconductor layer 13; the lower end of the contact 63 is connected to a high-concentration portion 53 provided inside the second semiconductor layer 23; and the upper end of the contact 63 is connected to the second electrode 72.

The silicon oxide film 81 covers the side surface of the contact 63 and is provided between the contact 63 and the first semiconductor layer 13. Thereby, the contact 63 can electrically connect a second electrode 73 and the second semiconductor layer 23 in a state in which the contact 63 and the first semiconductor layer 13 are prevented from being electrically connected.

According to the embodiment, the second semiconductor layer 23 is formed by performing ion implantation into one location at a lower layer of the first semiconductor layer 13; therefore, the impurity concentration of the lower surface 23b of the second semiconductor layer 23 disposed in the lower layer of the first semiconductor layer 13 is high. Thereby, the ejection of the holes at the lower surface 23b in the OFF-state of the cell part CE can be performed quickly, and the breakdown of a terminal part EN3 can be prevented.

The second semiconductor layer 23 that is surrounded with the first semiconductor layer 13 is connected to the second electrode 72 via the contact 63 insulated from the first semiconductor layer 13. Thereby, the curvature of the depletion layer of the terminal part EN3 is relaxed, and a high electric field intensity is suppressed. Although the silicon oxide film 81 is used in the embodiment, the embodiment is not limited thereto. For example, the contact 63 can be prevented from being electrically connected to the first semiconductor layer 13 by using the p⁺ semiconductor layer and/or the metal film described above.

Otherwise, the configuration, the operations, and the effects of the embodiment are similar to those of the second embodiment.

Fourth Embodiment

In a terminal part EN4 of the embodiment, a terminal having a VLD structure is formed by providing a p-type third semiconductor layer 27 and one second semiconductor layer 24 formed similarly to the first embodiment.

Figure 16:
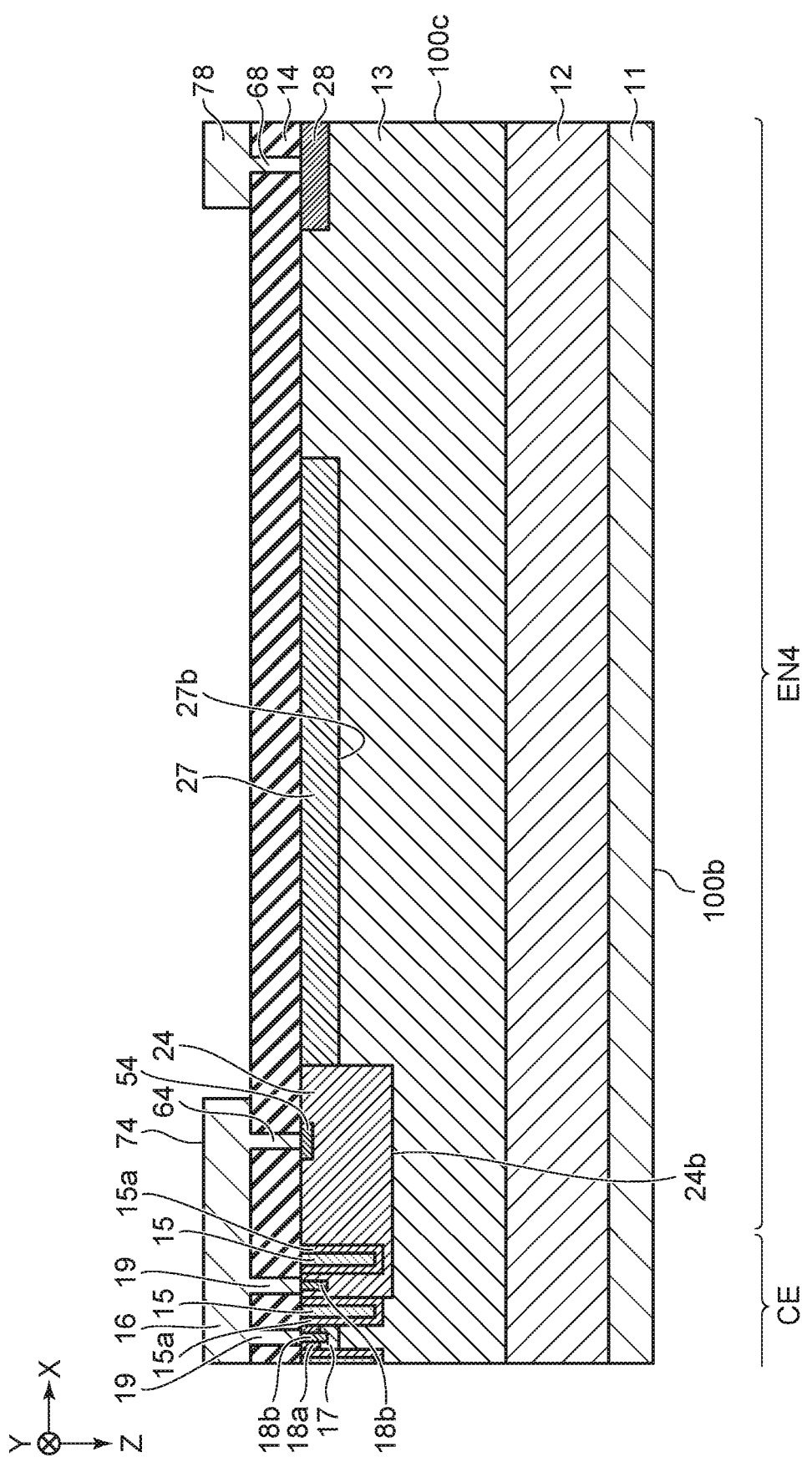
FIG. 16 is a cross-sectional view showing a semiconductor device according to a fourth embodiment.

FIG. 16 is a cross-sectional view showing a semiconductor device according to the embodiment.

The second semiconductor layer 24 is provided in the upper portion of the first semiconductor layer 13. Similarly to the first embodiment, the second semiconductor layer 24 is formed by implanting boron by ion implantation to multiple positions in the Z-direction and has a concentration profile of boron in the Z-direction having multiple peaks. The second semiconductor layer 24 surrounds one or more of each of the emitter contact layer 18*b*, the gate electrode 15, and the gate insulating film 15*a* disposed at the outermost side in the cell part CE. The second semiconductor layer 24 is connected to a second electrode 74, and the second electrode 74 is formed to have a continuous body with the emitter electrode 16.

The third semiconductor layer 27 is provided in the upper portion of the first semiconductor layer 13. The third semiconductor layer 27 extends in the X-direction between the second semiconductor layer 24 and the terminal semiconductor layer 28. The third semiconductor layer 27 is next to the side of the second semiconductor layer 24 opposite to the cell part CE and is separated from the terminal semiconductor layer 28. The first semiconductor layer 13 is interposed between the third semiconductor layer 27 and the terminal semiconductor layer 28. The third semiconductor layer 27 is made of a p-type semiconductor having a lower boron concentration than the second semiconductor layer 24. In the embodiment, the third semiconductor layer 27 has the emitter potential by being connected to the second semiconductor layer 24 that is connected to the emitter electrode 16.

According to the embodiment, by providing the third semiconductor layer 27, the depletion layer is formed to extend in the X-direction along a lower surface 27*b* of the third semiconductor layer 27. Thereby, depletion can occur widely along a lower surface 24*b* of the second semiconductor layer 24 and the lower surface 27*b* of the third semiconductor layer 27, and the concentration of the electric field of the terminal part EN4 can be suppressed.

Otherwise, the configuration, the operations, and the effects of the embodiment are similar to those of the first embodiment.

According to the embodiments of the invention, a semiconductor device that has high reliability can be provided.

Hereinabove, embodiments of the invention are described with reference to specific examples. However, the embodiments of the invention are not limited to these specific examples. For example, one skilled in the art may similarly practice the invention by appropriately selecting specific configurations of the cell part and the terminal part included in the semiconductor device, the impurities included in the semiconductor layers, and the materials included in the contacts and the electrodes from known art; and such practice is within the scope of the invention to the extent that similar effects can be obtained. Combinations of any two or more components of the specific examples within the extent of technical feasibility also are within the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device having a cell part and a terminal part set in the device, the terminal part enclosing the cell part, the device comprising:
   a first electrode;
   a first semiconductor layer formed above the first electrode, the first semiconductor layer being of a first conductivity type;
   a second semiconductor layer provided in an upper portion of the first semiconductor layer, the second semiconductor layer being located in the terminal part, the second semiconductor layer being of a second conductivity type and having an impurity concentration profile along a vertical direction including a plurality of peaks;
   an insulating layer provided on the second semiconductor layer,
   a gate electrode formed under the insulating layer in the cell part;
   an emitter electrode separated from the gate electrode in the cell part; and
   an insulating film interposed between the gate electrode and the first semiconductor layer in the cell part,
   wherein the second semiconductor layer is separated from the gate electrode, and
   a part of the first semiconductor layer is interposed between the gate electrode and the second semiconductor layer.

2. The device according to claim 1, wherein
   the second semiconductor layer includes two bulges arranged in the vertical direction, and a narrow portion provided between the two bulges.

3. The device according to claim 1, wherein the first semiconductor layer surrounds the second semiconductor layer.

4. The device according to claim 3, further comprising:
   a second electrode formed on the insulating layer; and
   a contact connecting the second electrode and the second semiconductor layer.

5. The device according to claim 4, further comprising:
   an insulating film covering the contact,
   the contact being insulated from the first semiconductor layer by the insulating film.

6. The device according to claim 4, further comprising:
   a semiconductor layer covering the contact, the semiconductor layer being of the second conductivity type and having a higher impurity concentration than the second semiconductor layer, the semiconductor layer being interposed between the contact and the first semiconductor layer.

7. The device according to claim 4, further comprising:
a metal film covering the contact and including at least one type of metal selected from the group consisting of aluminum, tantalum, silver, molybdenum, tungsten, cobalt, chrome, ruthenium, gold, palladium, nickel, and platinum,
the metal film being interposed between the contact and the first semiconductor layer.

8. The device according to claim 1, wherein
the second semiconductor layer is frame-shape, when viewed from above.

9. A semiconductor device having a cell part and a terminal part set in the device, the terminal part enclosing the cell part, the device comprising:
a first electrode;
a first semiconductor layer formed above the first electrode, the first semiconductor layer being of a first conductivity type;
a second semiconductor layer provided in an upper portion of the first semiconductor layer, the second semiconductor layer being of a second conductivity type and having an impurity concentration profile along a vertical direction including a plurality of peaks;
an insulating layer provided on the second semiconductor layer; and
a third semiconductor layer disposed at a side of the second semiconductor layer, the side opposite to a side of the cell part, the third semiconductor layer being of the second conductivity type and having a lower impurity concentration than the second semiconductor layer.

10. A semiconductor device having a cell part and a terminal part set in the device, the terminal part enclosing the cell part, the device comprising:
a first electrode;
a first semiconductor layer formed above the first electrode, the first semiconductor layer being of a first conductivity type;
a second semiconductor layer provided in an upper portion of the first semiconductor layer, the second semiconductor layer including a plurality of partial semiconductor layers separated in a vertical direction, the first semiconductor layer being interposed in a gap between the plurality of partial semiconductor layers, the plurality of partial semiconductor layers being of a second conductivity type; and
an insulating layer provided on the second semiconductor layer.

11. The device according to claim 10, wherein the first semiconductor layer surrounds the second semiconductor layer.

12. The device according to claim 10, further comprising:
a second electrode formed on the insulating layer; and
a contact connecting the second electrode and the second semiconductor layer.

13. The device according to claim 12, further comprising:
an insulating film covering the contact,
the contact being insulated from the first semiconductor layer by the insulating film.

14. The device according to claim 12, further comprising:
a semiconductor layer covering the contact, the semiconductor layer being of the second conductivity type and having a higher impurity concentration than the second semiconductor layer,
the semiconductor layer being interposed between the contact and the first semiconductor layer.

15. The device according to claim 12, further comprising:
a metal film covering the contact and including at least one type of metal selected from the group consisting of aluminum, tantalum, silver, molybdenum, tungsten, cobalt, chrome, ruthenium, gold, palladium, nickel, and platinum,
the metal film being interposed between the contact and the first semiconductor layer.

16. The device according to claim 10, further comprising:
a gate electrode formed under the insulating layer in the cell part;
an emitter electrode separated from the gate electrode in the cell part; and
an insulating film interposed between the gate electrode and the first semiconductor layer in the cell part.

17. The device according to claim 10, further comprising:
a third semiconductor layer disposed at a side of the second semiconductor layer, the side opposite to a side of the cell part, the third semiconductor layer being of the second conductivity type and having a lower impurity concentration than the second semiconductor layer.

* * * * *